(12) United States Patent
Chen et al.

(10) Patent No.: US 7,214,551 B2
(45) Date of Patent: May 8, 2007

(54) MULTIPLE GATE ELECTRODE LINEWIDTH MEASUREMENT AND PHOTOEXPOSURE COMPENSATION METHOD

(75) Inventors: Jia-Ren Chen, Tainan (TW); Hung Che Hsiue, Tainan (TW); Hann Huei Tsai, Tainan (TW); Wei Hsiung Hsu, Tainan (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 174 days.

(21) Appl. No.: 10/684,855

(22) Filed: Oct. 14, 2003

(65) Prior Publication Data

US 2005/0081168 A1   Apr. 14, 2005

(51) Int. Cl.
H01L 21/66   (2006.01)
(52) U.S. Cl. .................... 438/14; 438/128; 438/129; 438/599
(58) Field of Classification Search ................ 438/14, 438/128, 129, 599
See application file for complete search history.

(56) References Cited

U.S. PATENT DOCUMENTS 5,899,706 A * 5/1999 Kluwe et al. ............... 438/129
6,365,422 B1   4/2002 Hewett et al.

* cited by examiner

Primary Examiner—Thanh Nguyen
(74) Attorney, Agent, or Firm—Tung & Associates

(57) ABSTRACT

A method for fabricating a semiconductor product first provides an embedded semiconductor product comprising: (1) a logic region having formed therein a logic field effect transistor device; (2) a memory region having formed therein a memory field effect transistor device; and (3) a kerf region having formed therein a kerf field effect transistor device. The method also provides for measuring for the embedded semiconductor product a gate electrode linewidth for each of the logic field effect transistor device, the memory field effect transistor device and the kerf field effect transistor device. The measured gate electrode linewidths may be compared among themselves or to specified target values for purposes photoexposure process control.

20 Claims, 3 Drawing Sheets

MULTIPLE GATE ELECTRODE LINEWIDTH MEASUREMENT AND PHOTOEXPOSURE COMPENSATION METHOD

BACKGROUND OF THE INVENTION

1. Field of the Invention

The invention relates generally to methods for fabricating semiconductor products. More particularly, the invention relates to methods for efficiently monitoring semiconductor structures when fabricating semiconductor products.

2. Description of the Related Art

Common in the semiconductor product fabrication art is the use of field effect transistor devices as switching devices within logic semiconductor products, memory semiconductor products and embedded logic and memory semiconductor products. Field effect transistor devices comprise a gate electrode formed over a semiconductor substrate. The gate electrode defines a channel region within the semiconductor substrate. The gate electrode and the channel region further separate a pair of source/drain regions formed within the semiconductor substrate.

While field effect transistor devices are quite common and essential in the semiconductor product fabrication art, field effect transistor devices are nonetheless not entirely without problems.

In that regard, as field effect transistor device dimensions decrease, it becomes increasingly difficult to form semiconductor products with consistent performance since even small deviations from expected field effect transistor dimensions (in particular gate electrode linewidth and channel linewidth dimensions) may provide for considerable deviations in field effect transistor device performance.

It is thus desirable in the semiconductor product fabrication art to provide methods for efficiently monitoring and controlling field effect transistor device dimensions.

The present invention is directed towards the foregoing object.

Various methods for monitoring and controlling semiconductor device dimensions and performance have been disclosed in the semiconductor product fabrication art.

Included but not limiting among the methods are those disclosed within Hewett et al., in U.S. Pat. No. 6,365,422 (an integrated process control method predicated upon across wafer semiconductor device dimension measurements). The disclosure of the foregoing reference is incorporated herein fully by reference.

Desirable are additional methods for efficiently monitoring and controlling semiconductor device dimensions and performance when fabricating semiconductor products.

The invention is directed towards the foregoing object.

SUMMARY OF THE INVENTION

A first object of the invention is to provide a method for monitoring and controlling semiconductor device dimensions when fabricating semiconductor products.

A second object of the invention is to provide a method in accord with the first object of the invention, where the method is efficient.

In accord with the objects of the invention, the invention provides a method for fabricating a semiconductor product.

The method first provides an embedded semiconductor product comprising: (1) an embedded logic region having formed therein a logic field effect transistor device; (2) an embedded memory region having formed therein a memory field effect transistor device; and (3) a kerf region having formed therein a kerf field effect transistor device. The method also provides for measuring for the embedded semiconductor product a gate electrode linewidth for each of the logic field effect transistor device, the memory field effect transistor device and the kerf field effect transistor device.

The gate electrode linewidths of the logic field effect transistor device, the memory field effect transistor device and the kerf field effect transistor device may be compared to each other or to specified target values. Incident to such a comparison, adjustments may be made to a photomask or a photoexposure source when forming additional embedded semiconductor products such as to provide measured values of the gate electrode linewidths closer to the specified target values of the gate electrode linewidths.

The invention provides a method for efficiently monitoring and controlling semiconductor device dimensions and performance when fabricating a semiconductor product. The invention realizes the foregoing object by measuring within an embedded semiconductor product a gate electrode linewidth of each of a logic field effect transistor device, a memory field effect transistor device and a kerf field effect transistor device. Since gate electrode linewidth within a field effect transistor device defines a channel width within the field effect transistor device which in turn generally defines performance characteristics of the field effect transistor device, comparison of the foregoing gate electrode linewidths provides for efficient monitoring and control of semiconductor device dimensions and performance when fabricating a semiconductor product.

BRIEF DESCRIPTION OF THE DRAWINGS

The objects, features and advantages of the invention are understood within the context of the Description of the Preferred Embodiment, as set forth below.

The Description of the Preferred Embodiment is understood within the context of the accompanying drawings, which form a material part of this disclosure, wherein.

DESCRIPTION OF THE PREFERRED EMBODIMENT

The invention provides a method for efficiently monitoring and controlling semiconductor device performance when fabricating a semiconductor product. The invention realizes the foregoing object by measuring within an embedded semiconductor product a gate electrode linewidth of each of a logic field effect transistor device, a memory field effect transistor device and a kerf field effect transistor device. Since gate electrode linewidth within a field effect transistor device defines a channel width within the field effect transistor device which in turn generally defines performance characteristics of the field effect transistor device, comparison of the foregoing gate electrode linewidths provides for efficient monitoring and control of semiconductor device dimensions and performance when fabricating a semiconductor product.

Figure 1:
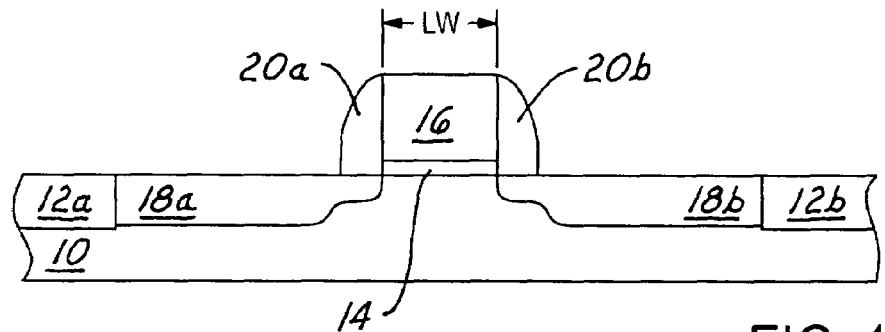
FIG. 1 shows a schematic cross-sectional diagram of a field effect transistor device whose gate electrode linewidth may be measured in accord with the preferred embodiment of the invention.

FIG. 1 shows a schematic cross-sectional diagram of a field effect transistor device whose gate electrode linewidth may be measured in accord with the preferred embodiment of the invention.

FIG. 1 shows a semiconductor substrate 10 having formed therein a pair of isolation regions 12a and 12b that define an active region of the semiconductor substrate 10.

The semiconductor substrate 10 may be of either dopant polarity, several dopant concentrations or various crystallographic orientations. The pair of isolation regions 12a and 12b is typically formed as a pair of shallow trench isolation regions formed within and upon the semiconductor substrate 10.

Within FIG. 1, the field effect transistor device comprises: (1) a gate dielectric layer 14 formed upon the semiconductor substrate 10; (2) a gate electrode 16 formed aligned upon the gate dielectric layer 14; (3) a pair of source/drain regions 18a and 18b formed within the semiconductor substrate 10 and separated by the gate electrode 16; and (4) a pair of spacer layers 20a and 20b formed upon a pair of opposite sidewalls of the gate electrode 16 and the gate dielectric layer 14. As is illustrated in FIG. 1, the gate electrode 16 has a linewidth LW, typically and preferably from about 0.05 to about 0.15 microns.

Within the invention, each of the foregoing structures that form the field effect transistor device may be formed employing methods and materials as are otherwise generally conventional in the semiconductor product fabrication art.

The gate dielectric layer 14 is typically formed of a silicon oxide material formed to a thickness of from about 10 to about 70 angstroms. The gate electrode 16 is typically formed of a conductively doped polysilicon material formed to a thickness of from about 1500 to about 3000 angstroms. The pair of spacer layers 20a and 20b is typically formed of a silicon oxide material or silicon nitride material that is anisotropically etched to form the pair of spacer layers 20a and 20b. The pair of source/drain regions 18a and 18b is formed employing a two step ion implantation method to form a pair of comparatively lightly doped regions beneath the pair of spacer layers 20a and 20b and a pair of more heavily doped regions otherwise exposed within the semiconductor substrate 10.

Figure 2:
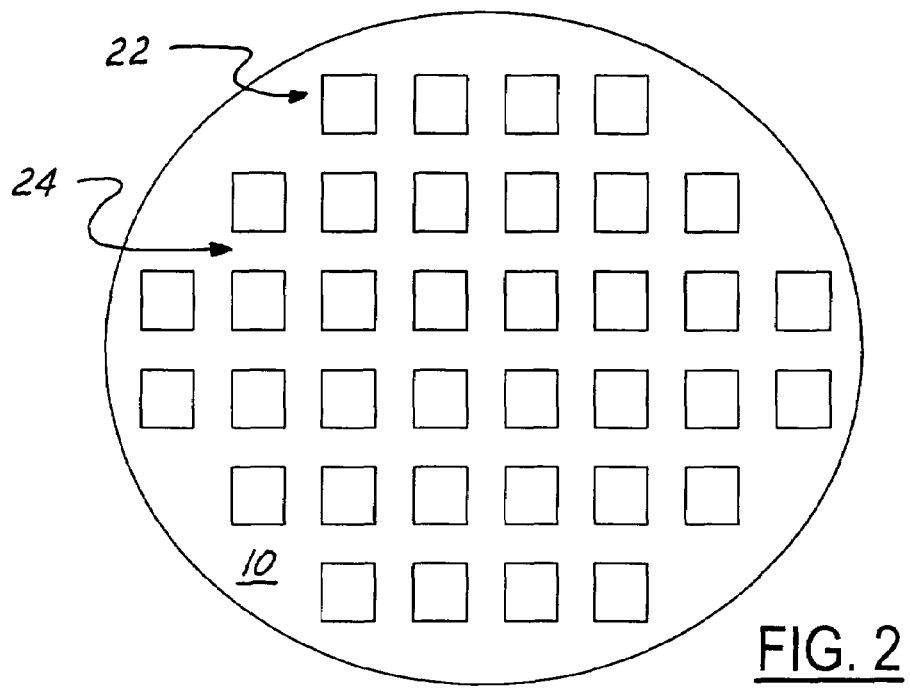
FIG. 2 and FIG. 3 show a pair of schematic plan view diagrams of a semiconductor substrate having formed therein semiconductor die in accord with the invention.

FIG. 2 shows a schematic plan view diagram of the semiconductor substrate 10 having formed therein a series of semiconductor die 22 in accord with the invention. As is illustrated in FIG. 3, the series of semiconductor die 22 is separated by a series of kerf regions 24 within the semiconductor substrate 10.

Figure 3:
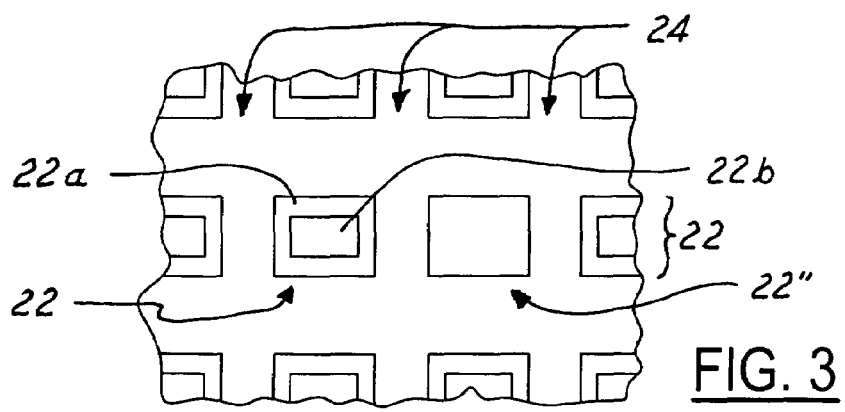

FIG. 3 shows a schematic plan-view diagram illustrating in greater magnification a portion of the semiconductor product of FIG. 2.

Within FIG. 3, most of the semiconductor die 22 are illustrated as having a core memory region 22b that is surrounded by a peripheral logic region 22a. Thus, FIG. 2 and FIG. 3 illustrate an embedded logic and memory semiconductor product having embedded logic and memory semiconductor die 22'. FIG. 3 also illustrates an additional semiconductor die 22" that is intended as a semiconductor die other than an embedded logic and memory semiconductor die 22' (i.e., it does not have a core memory region 22b surrounded by a peripheral logic region 22a) and is formed within other than a kerf region 24.

The invention provides for forming at least one field effect transistor device within the logic portion 22a of the embedded logic and memory semiconductor die 22', the memory portion 20b of the embedded logic and memory semiconductor die 22' and within the kerf region 24 of the semiconductor substrate 10. In addition, the invention also optionally provides for forming a field effect transistor device within a non-kerf region and non-embedded region of the semiconductor substrate 10, such as for example within the additional semiconductor die 22". Under such circumstances, the non-embedded additional semiconductor die 22' might serve as a test site die within the semiconductor product as illustrated in FIG. 2 or FIG. 3. When more than one field effect transistor device is formed within the logic portion 22a, the memory portion 22b, the kerf region 24 or the additional die 22", it may be separated from an adjacent field effect transistor device by a linewidth to separation distance ratio of from about 1:1 to about 1:1000.

Figure 4:
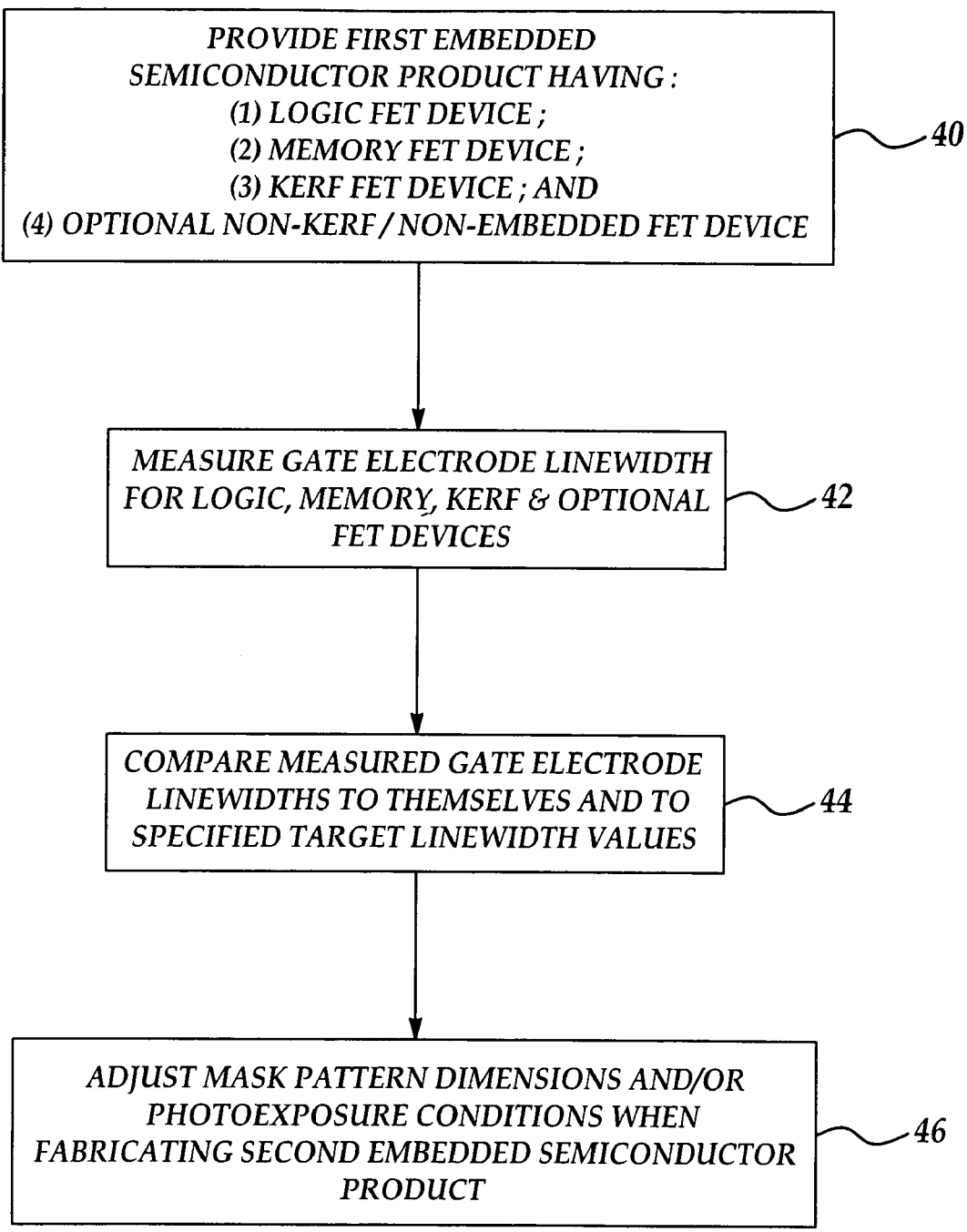
FIG. 4 shows a process flow diagram illustrating the method of the invention.

FIG. 4 shows a schematic process flow diagram that provides a series of process steps in accord with the invention.

In accord with process step 40, the invention provides a first embedded semiconductor product. In accord with the above description, the first embedded semiconductor product comprises: (1) a logic field effect transistor device formed within an embedded logic region; (2) a memory field effect transistor device formed within am embedded memory region; (3) a kerf field effect transistor device formed within a kerf region; and (4) an optional non-kerf/non-embedded field effect transistor device formed within an optional non-kerf/non-embedded region.

The field effect transistor devices are formed similarly with the field effect transistor device as illustrated in FIG. 1.

In accord with reference numeral 42, the invention provides for measuring a gate electrode linewidth for each of the logic field effect transistor device, the memory field effect transistor device, the kerf field effect transistor device and the optional non-kerf/non-embedded field effect transistor device.

The linewidth measurements may be undertaken employing methods as are conventional in the art. The methods may include, but are not limited to scanning electron microscopy measurement methods and optical measurement methods. The linewidth measurements may be undertaken in-situ or ex-situ.

In accord with reference numeral 44, the invention provides for comparing the measured gate electrode linewidths: (1) between themselves; and (2) to specified gate electrode linewidth target values for the embedded semiconductor product within which is formed the series of field effect transistor devices. The invention intends that the gate electrode linewidths are a measure of channel widths within the series of field effect transistor devices. In turn, channel widths relate to field effect transistor device performance.

In accord with reference numeral 46, the invention finally provides for an adjustment in mask pattern dimensions and/or photoexposure conditions when fabricating a second embedded semiconductor product analogous or identical to the first embedded semiconductor product. The mask dimensions or the photoexposure conditions are adjusted within the context of deviations of the measured gate electrode linewidths from specified gate electrode linewidth target values such that newly measured gate electrode linewidths (for the second embedded semiconductor product) more closely approximate specified gate electrode linewidth target values.

Figure 5:
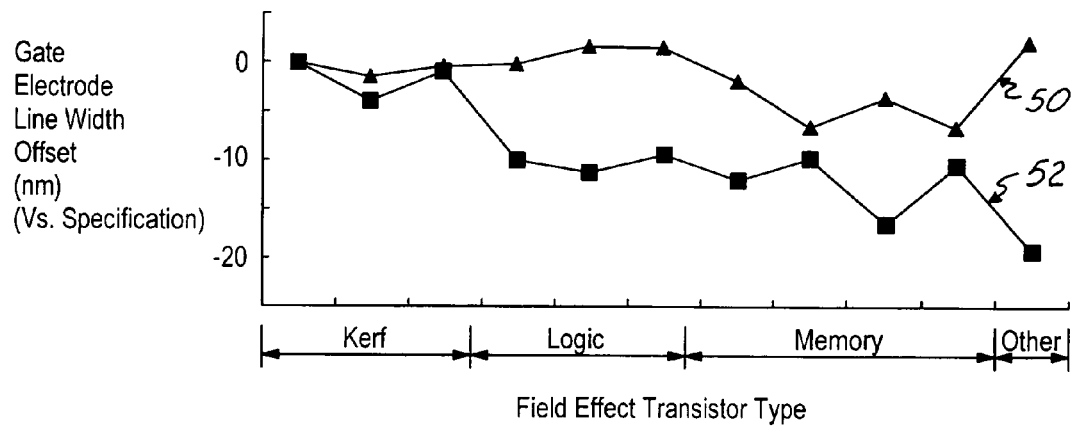
FIG. 5 shows a graph of Gate Electrode Linewidth Offset versus Field Effect Transistor Type for gate electrodes formed employing two separate masks.

FIG. 5 shows a graph of Gate Electrode Linewidth Offset versus Field Effect Transistor Type for forming a pair of embedded semiconductor products while employing either a first photomask (i.e., data points corresponding with reference numeral 50) or a second photomask (i.e., data points corresponding with reference numeral 52). As is illustrated in FIG. 5, field effect transistor devices formed within a kerf region within the pair of embedded semiconductor products are formed with closely related tolerances and linewidths, while field effect transistor devices formed within logic, memory and other (i.e., non-kerf and non-embedded) regions are formed with greater linewidth deviations when formed with the second mask (i.e., reference numeral 52) than with the first mask (i.e., reference numeral 50). The data of FIG. 5 thus suggest a deviation of mask pattern dimensions from desired dimensions within the second mask in comparison with the first mask.

Figure 6:
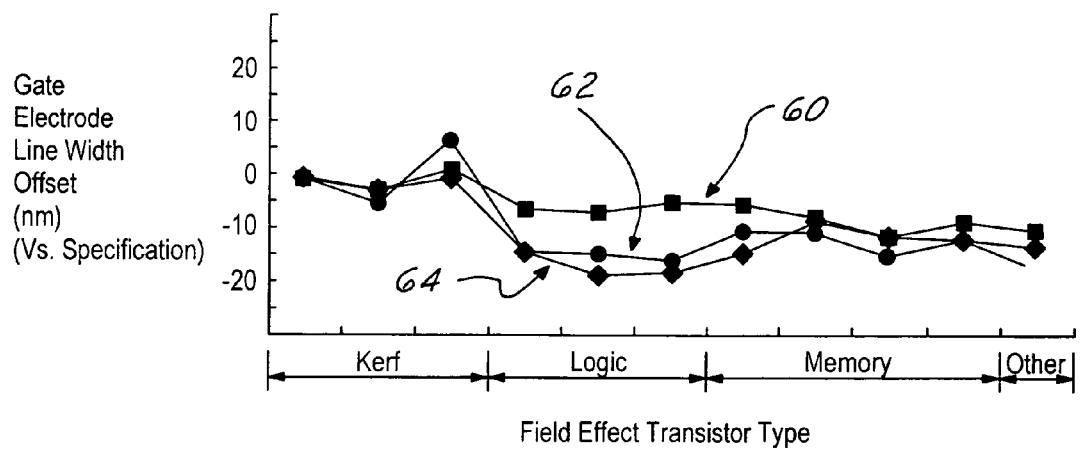
FIG. 6 shows a graph of Gate Electrode Linewidth Offset versus Field Effect Transistor Type for gate electrodes formed employing separate photoexposure apparatus.

FIG. 6 shows a graph of Gate Electrode Linewidth Offset versus Field Effect Transistor Type for three embedded semiconductor products formed employing a single mask, but with differing photoexposure tools. Reference numeral 60 corresponds with the gate electrode linewidths for a first embedded semiconductor product. Reference numeral 62 corresponds with the gate electrode linewidths for a second embedded semiconductor product. Reference numeral 64 corresponds with the gate electrode linewidths for a third embedded semiconductor product. As is illustrated in FIG. 6, gate electrode linewidths for the second embedded semiconductor product and the third embedded semiconductor product are generally coincident within all regions, but the gate electrode linewidths within the logic region within the first embedded semiconductor product uniquely deviate. The data of FIG. 6 thus suggest the possibility of a deviation in photoexposure illumination with the logic region of the tool employed for photoexposing the first embedded semiconductor product in comparison with the tools employed for photoexposing the second embedded semiconductor product and the third embedded semiconductor product.

The preferred embodiments and examples of the invention are illustrative of the invention rather than limiting of the invention. Revisions and modifications may be made to methods, materials, structures and dimensions in accord with the preferred embodiment and examples of the invention while still providing embodiments and examples in accord with the invention, further in accord with the accompanying claims.

What is claimed is:

1. A method for fabricating a semiconductor product comprising:
   providing an embedded semiconductor product comprising:
      an embedded logic region having formed therein a logic field effect transistor device;
      an embedded memory region having formed therein a memory field effect transistor device; and
      a kerf region having formed therein a kerf field effect transistor device;
   measuring for the embedded semiconductor product a gate electrode linewidth for each of the logic field effect transistor device, the memory field effect transistor device and the kerf field effect transistor device to determine a deviation of each of said linewidths with respect to a respective target value linewidth; and,
   adjusting at least one of a mask pattern dimension and an exposure condition to compensate for the deviation in the formation of a second semiconductor product.

2. The method of claim 1 wherein each of the logic field effect transistor device, the memory field effect transistor device and the kerf field effect transistor device has a linewidth of from about 0.05 to about 0.15 microns.

3. The method of claim 1 wherein each of the logic field effect transistor device and the memory field effect transistor device has a gate electrode linewidth:separation distance ratio of from about 1:1 to about 1:1000.

4. The method of claim 1 wherein the embedded semiconductor product further comprises a non-kerf and non-embedded region having formed therein a non-kerf and non-embedded field effect transistor device.

5. The method of claim 4 further comprising measuring a gate electrode linewidth of the non-kerf and non-embedded field effect transistor device.

6. A method for fabricating a semiconductor product comprising:
   providing an embedded semiconductor product comprising:
      an embedded logic region having formed therein a logic field effect transistor device;
      an embedded memory region having formed therein a memory field effect transistor device; and
      a kerf region having formed therein a kerf field effect transistor device;
   measuring for the embedded semiconductor product a gate electrode linewidth for each of the logic field effect transistor device, the memory field effect transistor device and the kerf field effect transistor device;
   determining a deviation of each of said gate electrode linewidths from a respective specified target linewidth value; and,
   adjusting at least one of a mask pattern dimension and an exposure condition to approach the respective specified target linewidth value in the formation of a second semiconductor product.

7. The method of claim 6 wherein each of the logic field effect transistor device, the memory field effect transistor device and the kerf field effect transistor device has a linewidth of from about 0.05 to about 0.15 microns.

8. The method of claim 6 wherein each of the logic field effect transistor device and the memory field effect transistor device has a gate electrode linewidth:separation distance ratio of from about 1:1 to about 1:1000.

9. The method of claim 6 wherein the step of determining comprises comparing the measured gate electrode linewidths with respect to one another.

10. The method of claim 6 wherein the step of determining comprises comparing the measured gate electrode linewidths with respect to the respective specified target value.

11. The method of claim 6 wherein the embedded semiconductor product further comprises a non-kerf and non-embedded region having formed therein a non-kerf and non-embedded field effect transistor device.

12. The method of claim 11 further comprising measuring a gate electrode linewidth of the non-kerf and non-embedded field effect transistor device.

13. A method for fabricating a semiconductor product comprising:
   providing an embedded semiconductor product comprising:
      an embedded logic region having formed therein a logic field effect transistor device;

an embedded memory region having formed therein a memory field effect transistor device; and a kerf region having formed therein a kerf field effect transistor device;

measuring for the embedded semiconductor product a gate electrode linewidth for each of the logic field effect transistor device, the memory field effect transistor device and the kerf field effect transistor device;

comparing the gate electrode linewidths for each of the logic field effect transistor device, the memory field effect transistor device and the kerf field effect transistor device to specified target values to determine a set at deviations therefrom; and fabricating a second embedded semiconductor product while adjusting at least one of a mask pattern dimension and an exposure condition such as to compensate for the set of deviations.

14. The method of claim 13 wherein each at the logic field effect transistor device, the memory field effect transistor device and the kerf field effect transistor device has a linewidth of from about 0.05 to about 0.15 microns.

15. The method of claim 13 wherein each of the logic field effect transistor device and the memory field effect transistor device has a gate electrode linewidth:separation distance ratio of from about 1:1 to about 1:1000.

16. The method of claim 13 wherein the embedded semiconductor product further comprises a non-kerf and non-embedded region having formed therein a non-kerf and non-embedded field effect transistor device.

17. The method of claim 16 further comprising measuring a gate electrode linewidth of the non-kerf and non-embedded field effect transistor device.

18. The method of claim 13 wherein only the mask pattern dimension is adjusted.

19. The method of claim 13 wherein only the photoexposure condition is adjusted.

20. The method of claim 13 wherein both of the mask pattern dimension and the photoexposure condition are adjusted.

* * * * *